United States Patent [19]

Mogi

[11] 4,227,259
[45] Oct. 7, 1980

[54] CIRCUIT FOR USE IN REMOTE CONTROL OF A SIGNAL RECEIVER

[75] Inventor: Takao Mogi, Tokyo, Japan
[73] Assignee: Sony Corporation, Tokyo, Japan
[21] Appl. No.: 30,820
[22] Filed: Apr. 17, 1979
[30] Foreign Application Priority Data
Apr. 19, 1978 [JP] Japan ............................... 53-46242
[51] Int. Cl.$^2$ ............................................. H04B 1/16
[52] U.S. Cl. .............................. 455/352; 358/194.1;
455/355
[58] Field of Search ............... 358/194; 325/390, 391,
325/392, 395; 340/539

[56] References Cited
U.S. PATENT DOCUMENTS
4,010,423 3/1977 Collins et al. .................. 325/392 X OTHER PUBLICATIONS
Radio–Electronics, pp. 58-60, 86, Jan. 1976.

*Primary Examiner*—Robert L. Richardson
*Attorney, Agent, or Firm*—Lewis H. Eslinger; Alvin Sinderbrand

[57] ABSTRACT

A control circuit for controlling selected functions in a signal receiver, such as a television receiver, in response either to remotely generated control signals of different selected frequencies or to manual controls which are provided on the signal receiver. The control circuit comprises an integrated circuit having a first input for receiving the remotely generated control signals. A frequency discriminator is included in the integrated circuit to detect the frequency of a signal applied thereto and to produce corresponding function control signals. A variable oscillator, also included in the integrated circuit, selectively generates local control signals of substantially the same different selected frequencies as the remotely generated control signals. A mixing circuit supplies the received remotely generated control signals or the local control signals to the frequency discriminator. A frequency control circuit, exernal of the integrated circuit and coupled to the manual controls, produces a variable frequency-control signal as a function of the operation of the manual controls. A second input provided in the integrated circuit connects the frequency control circuit to the variable oscillator, whereby the frequency of the local control signal generated by the variable oscillator is determined by the frequency-control signal produced by the frequency control circuit connected thereto.

15 Claims, 10 Drawing Figures

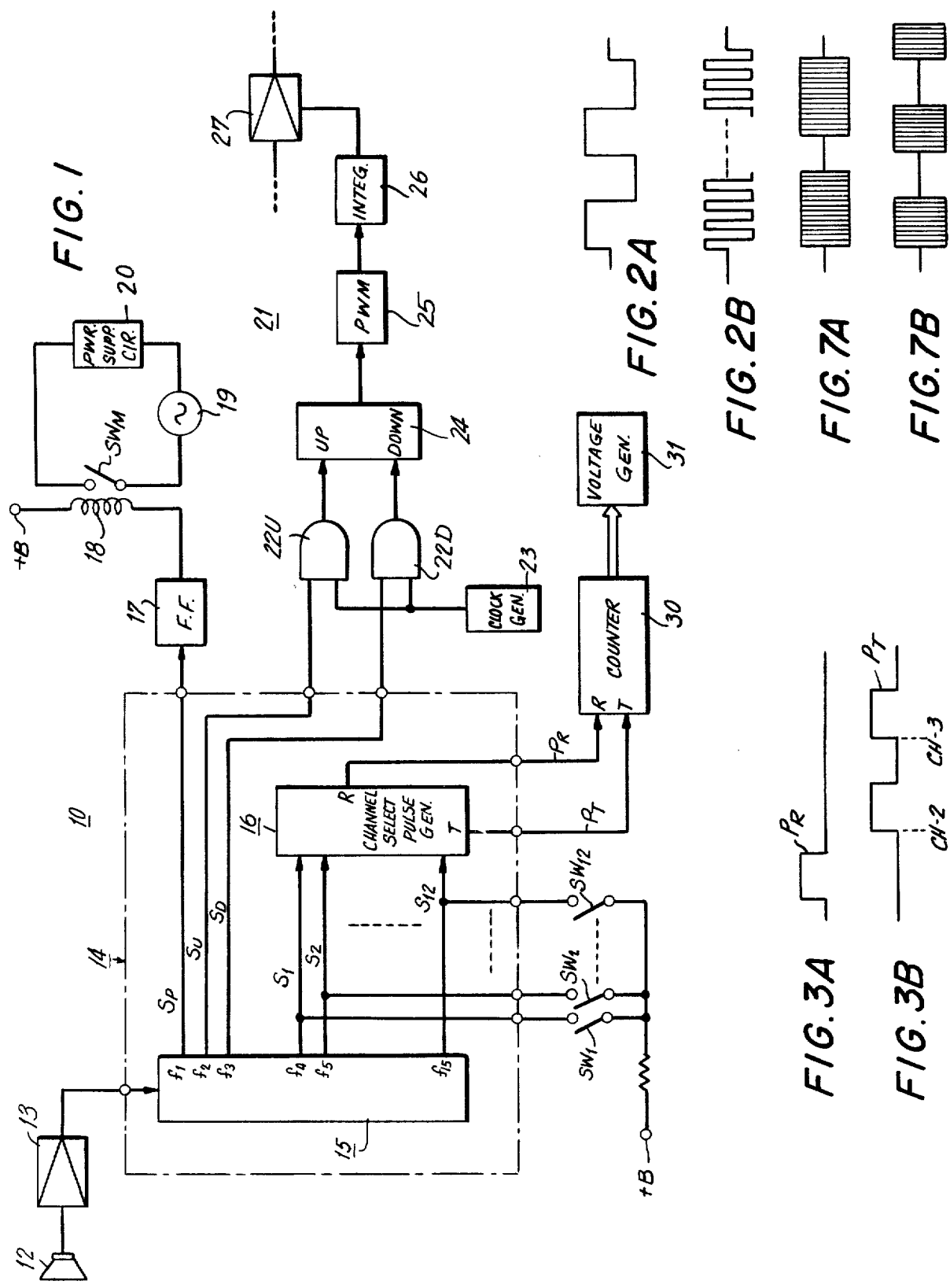

CIRCUIT FOR USE IN REMOTE CONTROL OF A SIGNAL RECEIVER

BACKGROUND OF THE INVENTION

This invention relates to a control circuit for controlling selected functions of a signal receiver, such as a television receiver, and more particularly, to such a control circuit which is responsive either to remotely generated control signals or to the operation of manual controls which are provided on the signal receiver.

In operating a signal receiver, such as a television receiver, it often is desirable to control the functions of that receiver either by the direct manual operation of suitable control switches which are provided on the receiver, or from a remote location. For example, and with respect to a television receiver, the power on/off function, the audio volume function and the channel selecting function can be controlled by these alternate means. Of course, in a conventional television receiver, a power on/off switch, an audio gain-controlled amplifier and an electronic tuner generally are provided for these functions. The television viewer merely operates the appropriate switches and control knobs in order to selectively control the various functions, or operations associated therewith. In addition, it is conventional to provide a control signal receiver which is adapted to receive remotely generated control signals for controlling many of the same functions which are controlled by the aforementioned switches and knobs.

Typically, to achieve remote control of a television receiver, the viewer is provided with a portable sonic or ultrasonic transmitter, and the television receiver is provided with a compatible sonic or ultrasonic receiver and decoder. The sonic or ultrasonic signal which is transmitted by the portable transmitter generally has a particular frequency component which is associated with the respective function to be controlled. For example, the power on/off function may be associated with one frequency, an increase in the audio volume may be associated with another frequency, a decrease in the audio volume may be associated with yet another frequency, and the selection of various channels may be associated with further respective frequencies. In some television receivers having this remote control capability, the sonic or ultrasonic receiver and decoder are separate and distinct from the manual controls which are provided directly on the receiver. That is, when the manual controls are operated, the remote control signal decoder is not used. This results in additional components for the television receiver, with a concomitant increase in cost.

With the advent of electronic tuners and integrated circuits, it is advantageous to provide a single control circuit which is responsive either to remotely generated control signals or to the operation of manual controls for selecting and controlling various functions of the television receiver. For example, the control circuit, which preferably is constructed as an integrated circuit, may include a decoder for decoding the received sonic or ultrasonic control signals and a channel selecting circuit which is responsive either to the decoded channel select signals, which are transmitted from the remote transmitter, or to the operation of channel selecting switches. The channel select circuit then is used to generate a tuning control voltage for selecting the desired channel to which the television receiver is to be tuned.

One disadvantage of the control circuit of the aforedescribed type is that, to provide a single control circuit, constructed as an integrated circuit, which is responsive either to a remotely generated control signal or to the operation of manual switches requires a large number of input terminals for the integrated circuit. That is, each manual switch generally must be connected to a respective integrated circuit input terminal. In general, the cost of manufacturing an integrated circuit is dependent, to some degree, upon the total number of input and output terminals which must be provided. Hence, the integrated circuit which is used as this control circuit is relatively expensive. Although the number of input terminals can be reduced if the integrated circuit is provided with an input stage of matrix configuration, such an integrated circuit still is relatively expensive to manufacture. A further reduction in the number of input terminals can be obtained by connecting the manual controls to the control circuit via an encoder. However, the reduction in cost attributed to the decrease in number of input terminals is accompanied by an increase in cost due to the requisite encoder.

Another disadvantage of the aforedescribed type of control circuit, even if provided with an input stage of matrix configuration or a signal encoder, is that the manual controls which are used to select the power on/off function and the audio volume adjustment function generally are not connected to the input circuit. As a consequence thereof, separate connections must be made between manual controls and the power supply and the audio amplifier, respectively, thereby increasing the cost of assembly. Moreover, the control circuit is not utilized efficiently.

OBJECTS OF THE INVENTION

Therefore, it is an object of the present invention to provide an improved control circuit of the aforedescribed type, for use in a signal receiver, which avoids the aforementioned disadvantages.

Another object of this invention is to provide a control circuit for controlling respective functions, or operations, of a signal receiver, such as a television receiver, either in response to remotely generated control signals or in response to the operation of manual controls, the latter being provided directly on the signal receiver.

A further object of this invention is to provide an improved control circuit for use in the remote control of a signal receiver, such as a television receiver, which includes an integrated circuit having a relatively small number of input and output terminals.

An additional object of this invention is to provide a control circuit for use in a signal receiver, such as a television receiver, for controlling particular operations of the signal receiver in response either to remotely generated control signals or to the operation of manual controls, which control circuit is constructed as a relatively inexpensive integrated circuit.

Various other objects, advantages and features of the present invention will become readily apparent from the ensuing detailed description, and the novel features will be particularly pointed out in the appended claims.

SUMMARY OF THE INVENTION

In accordance with the present invention, a control circuit is provided for controlling selected functions, or operations, in a signal receiver, such as a television receiver, in response either to remotely generated control signals of different selected frequencies or in response to manual controls which are provided directly on the signal receiver. The control circuit is constructed as an integrated circuit having a first input for receiving the remotely generated control signal, and including a frequency discriminator for detecting the frequency of a signal applied thereto to produce a corresponding operating control signal. A variable oscillator, also included in the integrated circuit, selectively generates local control signals of substantially the same different selected frequencies as the remotely generated control signals. A mixing circuit supplies the received remotely generated control signals or the local control signals to the frequency discriminator. A frequency control circuit, disposed externally of the integrated circuit, is coupled to the manual controls to produce a variable frequency-control signal as a function of the operation of such manual controls. The integrated circuit includes a second input for connecting the frequency control circuit to the variable oscillator; whereby the frequency of the local control signal generated by the variable oscillator is determined by the frequency-control signal produced by the frequency control circuit connected thereto.

In accordance with one advantageous feature of the present invention, the integrated circuit may be provided only with three input terminals: one input terminal to receive the remotely generated control signals; another input terminal to receive the frequency-control signal produced in response to the operation of the manual controls of the signal receiver; and a third input terminal to receive a power supply operating voltage.

BRIEF DESCRIPTION OF THE DRAWINGS

The following detailed description, given by way of example, will best be understood in conjunction with the accompanying drawings in which:

FIG. 1 is a block diagram of one type of control circuit which includes an integrated circuit that is provided with a large number of input terminals;

FIGS. 2A and 2B are waveform representations of the remotely generated control signals which are supplied to the control circuit;

FIGS. 3A and 3B are waveform representations of channel selecting signals which are produced by the control circuit;

FIGS. 7A and 7B are waveform representations of the remotely separated control signals which are produced by the transmitter shown in FIG. 6.

DETAILED DESCRIPTION OF A PREFERRED EMBODIMENT

Figure 4:
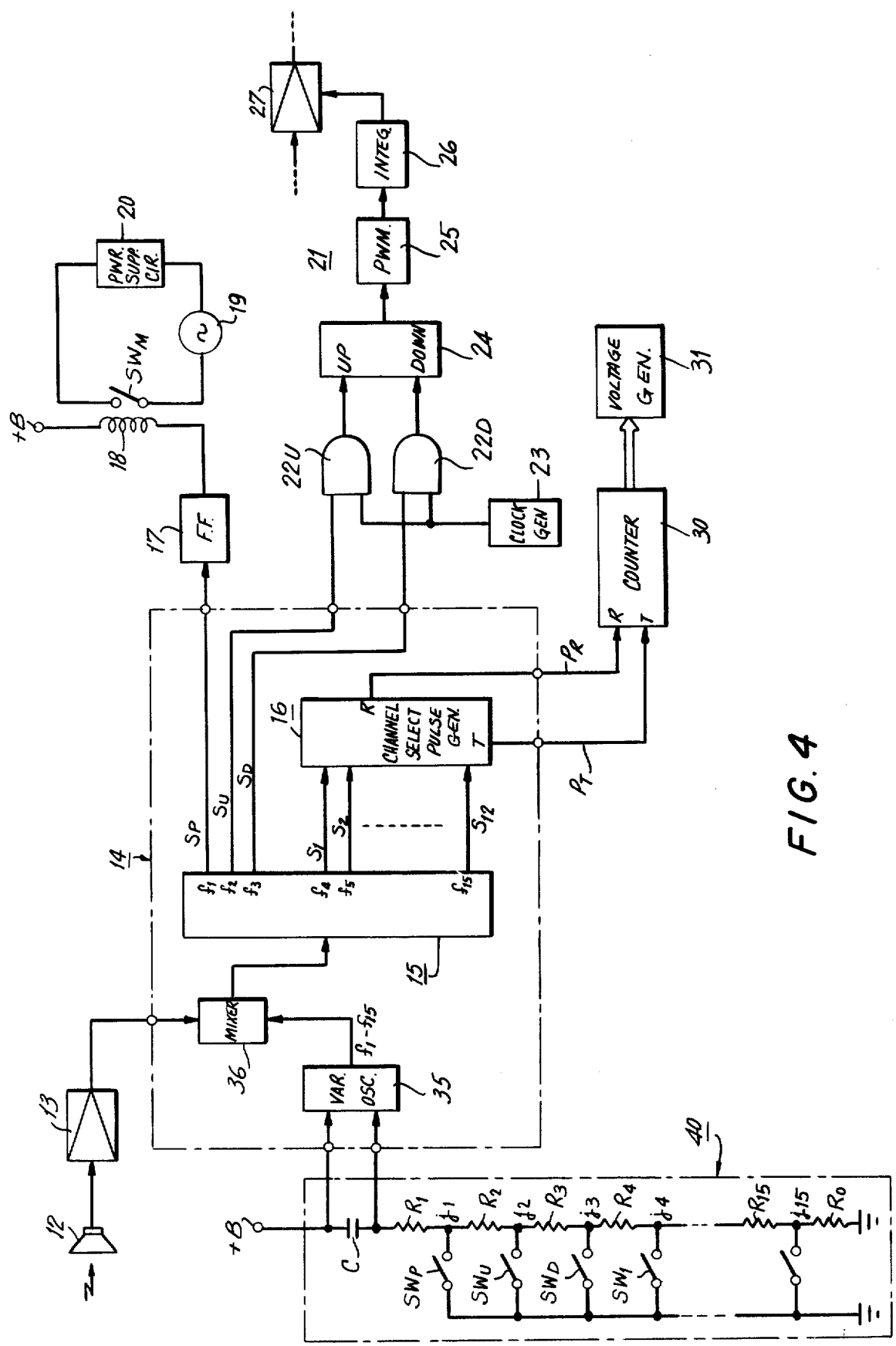
FIG. 4 is a block diagram of one embodiment of the present invention.

Before describing a preferred embodiment of the present invention, an example of a control circuit for use in a television receiver, constructed as an integrated circuit having a relatively large number of input terminals, first will be described with reference to FIG. 1. For the purpose of the following discussion, it will be assumed that the signal receiver with which the control circuit is used is a television receiver. However, it will be readily appreciated that any other type of signal receiver having functions or operations which are to be controlled either from a remote location or directly by suitable manual controls provided on the signal receiver, can be used with the control circuit. Moreover, the control circuit to be described finds general application with devices other than signal receivers, such as controllable appliances, and the like.

With reference to FIG. 1, the illustrated apparatus is comprised of a control circuit 14, a plurality of manually operable switches $SW_1$, $SW_2$, ... $SW_{12}$, a power supply on/off circuit shown as a flip-flop circuit 17 and a relay coil 18, an audio volume adjustment circuit shown as a pair of AND gates 22U, 22D, an up/down counter 24 and a count-to-voltage converter 21, a pulse counter 30 and a voltage generator 31. Control circuit 14 is constructed as an integrated circuit and includes a frequency discriminator 15 and a channel select pulse generator 16. Frequency discriminator 15 has an input connected to an input terminal of control circuit 14, the latter being supplied with remotely generated control signals. It will be assumed that the remotely generated control signals are transmitted as sonic or ultrasonic control signals having selectively different frequency components. A compatible transducer 12 is adapted to receive the sonic or ultrasonic control signal and to produce an electrical signal corresponding thereto. If, for example, the remote control signal is characterized by a carrier frequency associated with each function, or operation, to be controlled, then transducer 12 produces an electrical signal of a frequency which corresponds to the frequency of the received remote control signal. An amplifier 13 is connected between transducer 12 and the input terminal of integrated circuit 14 so as to suitably amplify the received remote control signal.

Frequency discriminator 15 may be conventional in that it is provided with a plurality of outputs, each output being associated with a particular frequency which is to be detected, or discriminated, by the frequency discriminator. As an example, let it be assumed that frequency discriminator 15 is capable of detecting fifteen different frequencies, each frequency being associated with a particular operation, or function, to be controlled. Accordingly, frequency discriminator 15 includes fifteen separate outputs, and an output signal is provided at a selected one of such outputs as a function of the frequency which is supplied thereto. The outputs of frequency discriminator 15 are designed $f_1-f_{15}$ so as to indicate which output signal is produced in response to the received control signal. That is, if the frequency of the received control signal is equal to $f_1$, then frequency discriminator 15 produces an output signal at its output $f_1$. Similarly, if the frequency of the received control signal is equal to $f_2$, then frequency discriminator 15 produces an output signal at its output $f_2$. It should be recognized that output signals are produced at any one of the remaining outputs of frequency discriminator 15, depending upon the frequency of the received control signal.

The output signal $S_P$ produced at output $f_1$ of frequency discriminator 15 is supplied via an output terminal of integrated circuit 14 to flip-flop circuit 17. This output signal $S_P$ is designated the power control signal and, as will be described, functions to turn on and turn off a power supply circuit for the signal receiver, such as by connecting the power supply circuit to AC mains. As shown in FIG. 1, the output of flip-flop circuit 17 is connected in series with relay coil 18 and a source of operating voltage +V. A movable contact $SW_M$ is operated when relay coil 18 is energized to complete a series circuit between a source of AC voltage 19, such as the aforementioned AC mains, and a power supply circuit 20, the latter being included in the signal receiver.

An output signal $S_U$ is produced at output $f_2$ of frequency discriminator 15 if the received remote control signal is of frequency $f_2$. Output signal $S_U$ constitutes a portion of an audio volume control signal and is supplied, via another output terminal of control circuit 14, to one input of an AND gate 22U. The output of this AND gate is connected to the count-up input of up-/down counter 24, the latter being adapted to count clock pulses which are supplied thereto via AND gate 22U. More particularly, the count of up/down counter 24 is incremented in response to each clock pulse which is supplied to its count-up input.

Output $f_3$ of frequency discriminator 15 is provided with an output signal $S_D$ if the received remote control signal is of frequency $f_3$. This output signal $S_D$ constitutes another portion of the audio volume control signal and is supplied via yet another output terminal of control circuit 14, to AND gate 22D. The output of this AND gate is connected to the count-down input of up/down counter 24. The count of this up/down counter is adapted to be decremented in response to each clock pulse that is supplied to its count-down input. As illustrated, a clock generator 23 is connected in common to AND gates 22U and 22D to supply clock pulses thereto, these clock pulses being transmitted via one or the other of these AND gates to the count-up or count-down input of up/down counter 24.

The count exhibited by up/down counter 24 is adapted to determine the audio volume of the television receiver. To this effect, a count-to-voltage converter 21 is connected to the output of the counter to produce a gain-controlling voltage as a function of the count. As one example, the count-to-voltage converter is comprised of a pulse width modulator (PWM) 25 connected to the output of up/down counter 24 to generate a pulse whose width, or duration, is a function of the count of the up/down counter, and the output of PWM 25 is connected to an integrator 26. The width-modulated pulse produced by PWM 25 is integrated by integrator 26 to produce a voltage whose magnitude, or level, is determined by the count of up/down counter 24. This voltage is supplied as a gain-adjusting voltage to gain-controlled amplifier 29. This amplifier functions to amplify the audio signal produced by the television receiver, the amount of amplification being determined by the gain-adjusting voltage produced by integrator 26 which, in turn, is a function of the count of up/down counter 24. Thus, the magnitude of the audio signal, and hence, the audio volume, is controlled by the count of this up/down counter.

Outputs $f_4-f_{15}$ of frequency discriminator 15 are adapted to produce output signals $S_1-S_{12}$ if the received control signal is of the frequencies $f_4-f_{15}$, respectively. These output signals $S_1-S_{12}$ are channel selection signals and are supplied to respective inputs of channel select pulse generator 16. The channel select pulse generator is adapted to generate a pulse train having a variable number of pulses therein. The number of pulses included in the generated pulse train is determined by the particular input at which a channel select signal is received. For example, and in the interest of simplification, if channel select signal $S_1$ is received, channel select pulse generator 16 generates a single pulse. If channel select signal $S_2$ is received, channel select pulse generator 16 generates two successive pulses. An analogous operation is performed in response to the remaining channel select pulses $S_3 \ldots S_{12}$. The channel select pulse generator includes a reset output and a trigger output. The reset output is coupled to another output terminal of control circuit 14 and is adapted to supply a reset pulse $P_R$ as the first pulse included in the pulse train generated by channel select pulse generator 16. The remaining pulses included in the generated pulse train are supplied as trigger pulses $P_T$ from output T to yet another output terminal of control circuit 14. Hence, if the pulse train generated by the channel select pulse generator is constituted by a single pulse, this single pulse is supplied as the reset pulse $P_R$. If the pulse train is constituted by two pulses, the first pulse is supplied as the reset pulse $P_R$ and the second pulse is supplied as the trigger pulse $P_T$. If the generated pulse train is constituted by three or more pulses, the first pulse is supplied as the reset pulse $P_R$ and the remaining pulses are supplied as the trigger pulses $P_T$.

A counter 30, which may comprise a conventional binary or digital counter, includes a reset input connected to receive the reset pulse $P_R$, and a trigger input connected to receive the trigger pulses $P_T$. The count of counter 30 is adapted to be reset to an initial count in response to the reset pulse $P_R$; and then to have the count thereof incremented in response to each following trigger pulse $P_T$. The count attained by counter 30 is coupled to a voltage generator 31 which is adapted to generate a voltage whose magnitude is determined by this count. The voltage generator may comprise a digital-to-analog converter of a construction known to those of ordinary skill in the art. As an alternative, voltage generator 31 may include a pulse width modulator and an integrator, similar to count-to-voltage converter 21, described above.

Control circuit 14, as thus far described, is adapted to control the power supply, audio volume and channel selection functions of a television receiver, all in response to remotely generated control signals. The control circuit also is adapted to control the channel selection function in response to the operation of manual switches $SW_1-SW_{12}$ which are provided directly on the television receiver. Each of these switches is associated with a respective channel to be received, and as shown, the switches are connected in common to a source of operating potential +B and, when closed, each switch is adapted to supply a DC level to a respective input of channel select pulse generator 16. That is, each of switches $SW_1-SW_{12}$ is connected in common with a respective one of outputs $f_4-f_{15}$ of frequency discriminator 15. This is achieved by providing control circuit 14 with additional (for example, twelve) input terminals, each such additional input terminal being connected to a corresponding one of switches $SW_1-SW_{12}$. When switch $SW_1$ is closed, channel select signal $S_1$ is supplied to channel select pulse generator 16. When switch $SW_2$ is closed, channel select signal $S_2$ is supplied to the channel select pulse generator. A similar operation is performed when any of the remaining switches $SW_3-SW_{12}$ is closed. Hence, a channel select signal $S_1-S_{12}$ is supplied to channel select pulse generator 16 either in response to a particular remote control signal or in response to the operation of a particular channel selector switch.

In operation, let it be assumed that relay coil 18 is de-energized and relay contact $SW_M$ is opened. This means that operating power is not supplied to the television receiver. If the power control signal is remotely generated, this power control signal is received at transducer 12 so as to supply frequency discriminator 15 with a remote control signal of frequency $f_1$. Hence, power control signal $S_p$ is produced so as to set (or reset) flip-flop circuit 17 to a state whereby relay coil 18 is energized. This, in turn, closes relay contact $SW_M$ so as to connect power supply circuit 20 to AC voltage source 19. If the power control signal is transmitted once again, frequency discriminator 15 supplies flip-flop circuit 17 with the power control signal $S_p$ so as to reset (or set) the flip-flop circuit, thereby de-energizing relay coil 18 and disconnecting power supply circuit 20 from AC voltage source 19.

If the audio volume control signal is generated remotely, for the purpose of increasing the audio volume, the remote control signal of frequency $f_2$ is supplied to frequency discriminator 15. Accordingly, audio control signal portion $S_U$ is applied to AND gate 22U, thereby enabling this AND gate to supply the clock pulses generated by clock generator 23 to the count-up input of up/down counter 24. Depending upon the duration of this audio volume control signal $S_U$, the count of up/down counter 24 will increase, thereby increasing the width, or duration, of the pulse produced by PWM 25. As a consequence thereof, the gain adjusting voltage produced by integrator 26 will increase so as to increase the gain of audio amplifier 27, thereby increasing the audio volume. Conversely, if the audio volume control signal is generated remotely so as to decrease the audio volume, frequency discriminator 15 produces the audio volume control signal portion $S_D$ which, in turn, enables AND gate 22D to supply the clock pulses generated by clock generator 23 to the count-down input of up/down counter 24. The count of this up/down counter thus decreases so as to reduce the width, or duration, of the pulse produced by PWM 25. This, in turn reduces the magnitude of the gain adjusting voltage produced by integrator 26 so as to decrease the gain of audio amplifier 27. Hence, the audio volume is reduced. The amount by which the audio volume is reduced is determined by the duration of audio control signal $S_D$.

FIGS. 2A and 2B are waveform representations of two examples of the control signals which are supplied to frequency discriminator 15 by transducer 12 and amplifier 13. FIG. 2A represents a lower frequency control signal; while FIG. 2B represents a higher frequency control signal. If these control signals are of rectangular waveform, frequency discriminator 15 may include a plurality of digital filters, for discriminating the respective frequencies $f_1$-$f_{15}$, and a detector connected to the output of each respective digital filter. As an example, frequency $f_1$ may be of a relatively higher frequency, such as represented by the waveform of FIG. 2B, and frequency $f_{15}$ may be of a relatively lower frequency, such as represented by the waveform of FIG. 2A. This frequency range may be from 20 to 200 Hz. Such frequencies can be transmitted to transducer 12 from a remote transmitter as suitable sonic signals.

It is appreciated that a channel select signal $S_1$-$S_{12}$ is supplied to channel select pulse generator 16 either by frequency discriminator 15, in response to a remotely generated control signal of frequency $f_4$-$f_{15}$, or in response to the operation of a selected one of channel select switches $SW_1$-$SW_{12}$. FIGS. 3A and 3B represent the operation of channel select pulse generator 16 when the channel select signal $S_3$ is supplied thereto. The channel select pulse generator generates a pulse train of, for example, three pulses, the first pulse being supplied as the reset pulse $P_R$ (FIG. 3A) and the remaining pulses being supplied as the trigger pulses $P_T$ (FIG. 3B). The reset pulse is supplied from the reset output of channel select pulse generator 16 to the reset input of counter 30 so as to reset the count of this counter to an initial count. The trigger pulses $P_T$ are supplied from the trigger output of channel select pulse generator 16 to the trigger input of counter 30 so as to increment the count of this counter. The count which ultimately is attained by counter 30 in response to trigger pulses $P_T$ is supplied to voltage generator 31 which, in turn, generates a tuning control voltage that is determined by the count supplied thereto. This tuning control voltage is supplied to the electronic tuner (not shown) of the television receiver. This tuning control voltage serves to tune the television receiver directly to the channel corresponding to channel 3. It may be appreciated that, since the tuning control voltage which is generated by voltage generator 31 is determined by the count attained by counter 30, the electronic tuner of the television receiver need not be stepped from one channel to the next until the desired channel is received. Rather, the electronic tuner is tuned directly to the selected channel.

In the example shown in FIG. 1, if control circuit 14 is constructed as an integrated circuit, it must be provided with a separate input terminal for each of channel select switches $SW_1$-$SW_{12}$. It has been assumed that twelve channel selected switches are provided and, therefore, twelve such input terminals are needed. In addition to these, an input terminal must be provided to connect frequency discriminator 15 to the remote control signal receiver, i.e., to transducer 12 and amplifier 13. Still another input terminal (not shown) must be provided to supply suitable operating potential to control circuit 14. Thus, in the illustrated example, fourteen separate input terminals, and also five separate output terminals must be provided. Of these nineteen total terminals for the integrated circuit, more than 70% are used as input terminals. This is a very high number of input terminals, resulting in a relatively expensive integrated circuit.

Assuming that five output terminals of control circuit 14 is an acceptable number of output terminals, the present invention successfully reduces the number of input terminals which must be provided. Specifically, and with reference to FIG. 4, the twelve separate input terminals which heretofore have been used for channel selection purposes are reduced merely to a single input terminal.

Referring more specifically to FIG. 4, wherein the same reference numerals are used as in FIG. 1 to identify the same components, control circuit 14 is comprised of frequency discriminator 15 and channel select pulse generator 16, as before, and also a variable oscillator 35 and a mixing circuit 36. Mixing circuit 36 includes one input connected to the input terminal of control circuit 14 for receiving the remotely generated control signal, and another input connected to variable oscillator 35. The output of mixing circuit 36 is connected to frequency discriminator 15 to supply a control signal thereto having a particular frequency $f_1 \ldots f_{15}$. The mixing circuit may be of conventional construction, for example, it may be comprised of a pair of mixer resistors which are connected to a common output that is coupled to the frequency discriminator.

Variable oscillator 35 is adapted to generate an oscillating signal whose frequency may be any one of frequencies $f_1 \ldots f_{15}$. That is, the frequency of the oscillating signal generated by variable oscillator 35 is within the same frequency range as the remotely generated control signals which are received by transducer 12 and amplifier 13. The particular frequency of the oscillating signal which is generated by variable oscillator 35 is determined by a frequency control circuit 40 that is connected to the variable oscillator.

In the illustrated embodiment, frequency control circuit 40 is a variable time constant circuit comprised of a capacitor C connected in series with a string of resistors $R_1, R_2, \ldots R_{15}$, these resistors being further connected in series with a resistor $R_o$ to ground. This series-connected time constant circuit is connected to a source of operating potential $+B$. This source also is connected to an input terminal of control circuit 14 so as to supply operating potential thereto. In the illustrated embodiment, this source of operating potential is coupled to variable oscillator 35. The output of frequency control circuit 40, that is, the output of the variable time constant circuit, is connected to another input terminal of control circuit 14, this other input terminal also being connected to variable oscillator 35. Thus, and as shown, capacitor C is connected across these input terminals and, thus, is connected across variable oscillator 35.

Frequency control circuit 40 additionally includes manually operable switches $SW_P$, $SW_U$, $SW_D$ and $SW_1$-$SW_{12}$. These control switches are adapted, when closed, to selectively control the various operations, or functions, of the television receiver. For example, switch $SW_P$ is adapted, when closed, to turn on or turn off the television receiver power supply circuit. Switch $SW_U$, when closed, is adapted to increase the audio volume. Switch $SW_D$, when closed, is adapted to decrease the audio volume. Switches $SW_1$-$SW_{12}$, when closed, are adapted to select a desired channel to which the television receiver is to be tuned.

Adjacent resistors $R_1$-$R_{15}$, $R_o$, define junctions $j_1 \ldots j_{15}$, respectively. Each junction is coupled via a respective switch $SW_P$, $SW_U$, $SW_D$, $SW_1 \ldots SW_{12}$ to ground. It may be appreciated that the total number of resistors, and thus the total resistance, connected to capacitor C is determined by which of the switches is closed. Stated otherwise, when a particular switch is closed, those resistors which are connected between the junction coupled to that switch and capacitor C are effectively connected in circuit, and those resistors which are connected to the other side of this junction, that is, between this junction and ground, are effectively short-circuited. Thus, when switch $SW_P$ is closed, resistor $R_1$ is connected to capacitor C, but closed switch $SW_P$ effectively short-circuits all of the remaining resistors $R_2$-$R_{15}$, $R_o$. When switch $SW_U$ is closed, resistors $R_1$ and $R_2$ are connected in series to capacitor C, and the remaining resistors are effectively short-circuited. A similar operation obtains when each of the remaining switches $SW_D$, $SW_1, \ldots SW_{12}$, is closed.

The time constant of the variable time constant circuit is determined by capacitor C and the total resistance connected thereto. That is, the time constant of the variable time constant circuit is determined by the total number of resistors which are connected to capacitor C. This time constant increases as the effective resistance increases. That is, as more resistors are connected in series to capacitor C, the time constant of circuit 40 is increased. Variable oscillator 35 includes, for example, a crystal oscillator, and the frequency of the oscillating signal generated thereby is determined by the time constant of circuit 40 connected thereto. As this time constant increases, the frequency of the generated oscillating signal decreases. Thus, when switch $SW_P$ is closed, variable oscillator 35 generates an oscillating signal of relatively higher frequency, for example, a frequency equal to $f_1$. When switch $SW_U$ is closed, the frequency of the oscillating signal generated by the variable oscillator is reduced to, for example, $f_2$. When switch $SW_D$ is closed, the increased time constant of circuit 40 results in a further decrease in the frequency of the oscillating signal to, for example, $f_3$. As the remaining switches $SW_1 \ldots SW_{12}$ are closed, the frequency of the oscillating signal generated by variable oscillator 35 changes from $f_4$ to $f_{15}$, accordingly.

It may be appreciated that mixing circuit 36 supplies a control signal to frequency discriminator 15 of a particular frequency ($f_1$-$f_{15}$) whether that control signal is generated remotely, or whether that control signal is generated by variable oscillator 35 in response to the selected operation of control switches $SW_P \ldots SW_{12}$. Frequency discriminator 15 thus produces the aforedescribed control signals $S_P$, $S_U$, $S_D$, $S_1 \ldots S_{12}$ irrespective of the source of the control signals supplied thereto by mixing circuit 36. Therefore, the power on/off function, the audio volume function and the channel selection function all are controlled by control circuit 14, depending upon the particular frequency of the control signal which is supplied to frequency discriminator 15. In the embodiment shown in FIG. 4, the same operations, or functions, of the television receiver are controlled by control circuit 14 as in the example of FIG. 1, but with far less input terminals thereto. That is, these functions are controlled either by remotely generated control signals, as received by transducer 12 and amplifier 13, or by the selective operation of the selector switches included in frequency control circuit 40—but now, instead of requiring twelve additional input terminals to control circuit 14, as in the example shown in FIG. 1, only one additional input terminal is needed. This one additional input terminal connects frequency control circuit 40 to variable oscillator 35 of control circuit 14. In addition to controlling the channel select function (which was controlled by the control circuit in the example of FIG. 1), the control circuit shown in FIG. 4 also controls the power on/off and audio volume function in response either to the remotely generated control signals or to the operation of the manual controls provided directly on the signal receiver.

Figure 5:
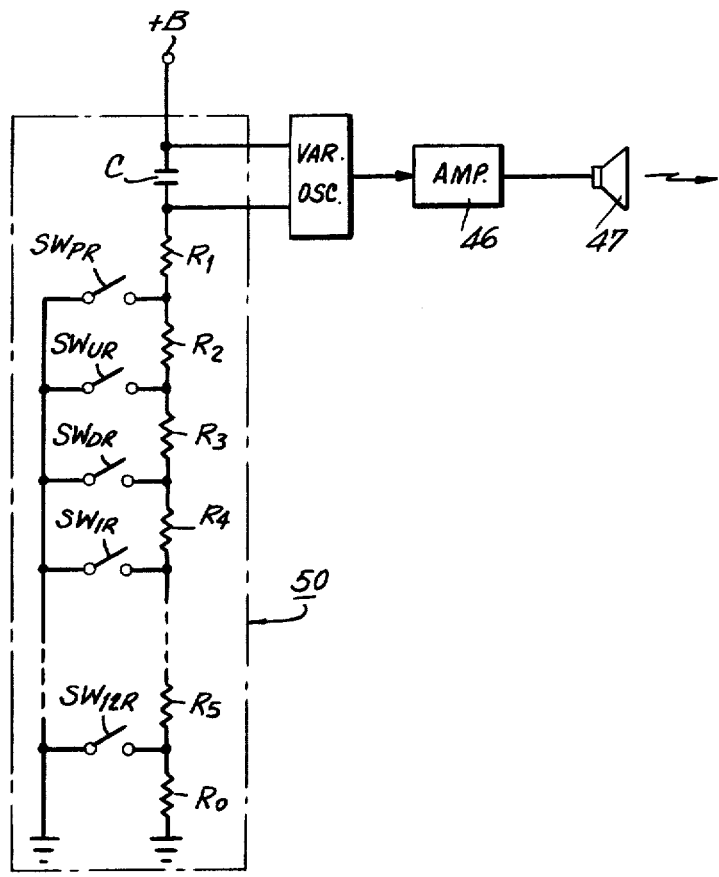
FIG. 5 is a partial block, partial schematic diagram of a portable transmitter which can be used with the control circuit of FIG. 4.

An example of a portable remote control transmitter which can be used with the embodiment of FIG. 4 is shown in FIG. 5. This transmitter includes a variable oscillator 45, similar to variable oscillator 35, a frequency control circuit 50, similar to frequency control circuit 40, an amplifier 46 and a transducer 47. The selector switches in frequency control circuit 50 are identified by the same reference numerals as the corresponding switches in frequency control circuit 40, except that the subscript "R" has been added to designate that these switches are included in the remote transmitter. In the interest of brevity, further description of frequency control circuit 50 is not provided. Suffice it to say that, depending upon the particular selector switch which is operated, the time constant of the frequency control circuit is determined by the total resistance which is effectively connected in series with capacitor C. Frequency control circuit 50 is connected to variable oscillator 45 so as to establish the frequency of the oscillating signal generated by the variable oscillator as a function of the time constant of the frequency control circuit. The oscillating signal generated by variable oscillator 45 is amplified by amplifier 46, and this amplified oscillating signal is converted to a sonic signal by transducer 47. This sonic signal, having a frequency determined by variable oscillator 45, is transmitted to the remote control signal receiver comprised of transducer 12 and amplifier 13 (FIG. 4).

Figure 6:
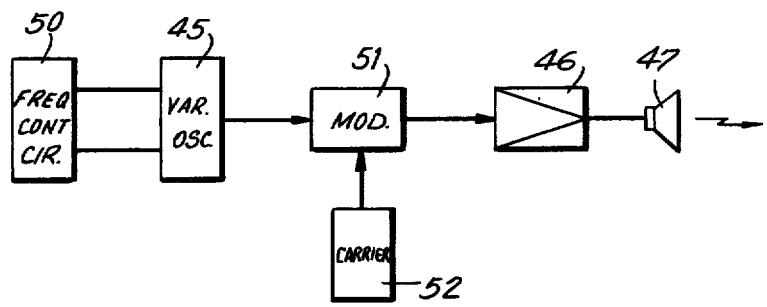
FIG. 6 is a block diagram of another embodiment of a portable transmitter which can be used with the present invention.

In the aforedescribed embodiments, it has been assumed that the remotely generated control signal is a sonic signal whose frequency is within the frequency range of 20 to 200 Hz. If desired, the remotely generated control signal can be used to modulate an ultrasonic signal. Such an embodiment of an ultrasonic transmitter is illustrated in FIG. 6. This transmitter includes frequency control circuit 50 and variable oscillator 45, shown and discussed in FIG. 5. The output of variable oscillator 45 is an oscillating signal whose frequency is determined by frequency control circuit 50. For example, the frequency of this oscillating signal may be a selected frequency in the range of 20 to 200 Hz.

The oscillating signal generated by variable oscillator 45 is connected to a modulator 51 supplied with a carrier 52. As one example, carrier 52 may have a frequency on the order of about 40 KHz. The oscillating signal generated by variable oscillator 45 modulates this carrier frequency as, for example, by amplitude modulation. The modulated carrier then is amplified by amplifier 46 and supplied to transducer 47 to be transmitted as a modulated ultrasonic signal. The ultrasonic signal has a carrier of about 40 KHz, and the modulating signal has a selected frequency in the range of 20 to 200 Hz, this frequency being determined by frequency control circuit 50. FIGS. 7A and 7B are waveform representations of two examples of the modulated ultrasonic signal. FIG. 7A represents a lower modulating frequency, such as will be produced by variable oscillator 45 if frequency control circuit 50 exhibits a relatively higher time constant; and FIG. 7B represents a higher modulating frequency; such as will be produced by the variable oscillator when the frequency control circuit exhibits a relatively lower time constant. It is appreciated that in the waveforms shown in FIGS. 7A and 7B, the frequency of the carrier is the same. Of course, if a modulated ultrasonic signal is generated, such as by the transmitter shown in FIG. 6, a compatible receiver should be provided in FIG. 4 wherein the modulated signal is demodulated so as to recover the original frequency components generated by variable oscillator 45, which frequency components are supplied via mixing circuit 36 to frequency discriminator 15.

In accordance with the present invention, a substantial reduction in the overall number of input terminals for control circuit 14 is achieved. This encourages the construction of this control circuit as an integrated circuit. Furthermore, by using channel select pulse generator 16 in combination with counter 30, the latter being disposed externally of the integrated circuit, a relatively small number of output terminals need be provided. That is, although twelve channel select signals $S_1$-$S_{12}$ are produced by frequency discriminator 15, only two output terminals are needed in order to select which of these twelve channels should be selected.

While the present invention has been particularly shown and described with reference to a preferred embodiment, it should be readily apparent to those of ordinary skill in the art that various changes and modifications in form and details may be made without departing from the spirit and scope of the invention. It is intended that the appended claims be interpreted as including all such changes and modifications.

What is claimed is:

1. A control circuit for controlling selected functions, comprising an integrated circuit having a first input for receiving control signals of different selected frequencies; frequency discriminating means included in said integrated circuit for detecting the frequency of a signal applied thereto to produce corresponding function signals; variable oscillating means included in said integrated circuit for selectively generating signals of substantially the same different selected frequencies as said received control signals; means for supplying said received control signals or said generated signals to said frequency discriminating means; variable time constant means external of said integrated circit and operative to exhibit different selected time constants; and a second input provided in said integrated circuit for connecting said variable time constant means to said variable oscillating means, whereby the frequency of the signal generated by said variable oscillating means is determined by the time constant of said variable time constant means connected thereto.

2. The control circuit of claim 1 wherein said integrated circuit includes a third input for receiving a power supply voltage; and wherein said variable time constant means also is connected to said third input.

3. The control circuit of claim 2 wherein said variable time constant means comprises a capacitor connected across said second and third inputs of said integrated circuit; a plurality of resistance means connected in series; and switch means for selectively connecting selected groups of series-connected resistance means to said capacitor, wherein a group is constituted by one or more of said resistance means.

4. The control circuit of claim 3 wherein said switch means comprises a plurality of switches, each associated with a function signal; and wherein said series-connected resistance means all are connected in series with said capacitor, the junctions between adjacent resistance means being connected to respective switches, such that when a switch is closed, the resistance means connected on one side of the associated junction are connected to said capacitor and the resistance means connected on the other side of said associated junction are effectively short-circuited.

5. The control circuit of claim 1 or 2, wherein said means for supplying said received control signals or said generated control signals to said frequency discriminating means comprises a mixing circuit included in said integrated circuit and having one input connected to the first input of said integrated circuit, another input connected to the output of said variable oscillating means, and an output connected to the input of said frequency discriminating means.

6. The control circuit of claim 1 further comprising pulse generating means responsive to predetermined ones of said function signals to generate a number of pulses, said number being determined by the particular function signal produced by said frequency discriminating means; counting means for counting the pulses generated by said pulse generating means; and means coupled to said counting means for producing a function control voltage in accordance with the count of said counting means.

7. A control circuit for use in a signal receiver, such as a television receiver, for controlling particular operations of said signal receiver, including channel selection, in response either to remotely generated control signals of different selected frequencies or to manual controls provided with said signal receiver, said control circuit comprising an integrated circuit having a first input terminal for receiving said remotely generated control signals; frequency discriminating means included in said integrated circuit for discriminating the frequency of a signal applied thereto to produce corresponding operating control signals, including channel selecting signals; variable oscillating means included in said integrated circuit for selectively generating local control signals of substantially the same different selected frequencies as said remotely generated control signals; means for supplying said received remoted generated control signals or said local control signals to said frequency discriminating means; frequency control means external of said integrated circuit and coupled to said manual controls to produce a variable frequency-control signal as a function of the operation of said manual controls; and a second input provided in said integrated circuit for connecting said frequency control means to said variable oscillating means, whereby the frequency of the local control signal generated by said variable oscillating means is determined by the frequency-control signals produced by said frequency control means connected thereto.

8. The control circuit of claim 7 wherein said manual controls comprise a plurality of manually operated switches, each switch being associated with a respective operation of said signal receiver; and wherein said frequency control means comprises time constant means coupled to said plurality of switches, the time constant exhibited by said time constant means being selected by the operation of a respective one of said switches, whereby the frequency of said local control signal is a function of said time constant exhibited by said time constant means.

9. The control circuit of claim 8 wherein said time constant means comprises capacitance means and a plurality of resistance means selectively connected to said capacitance means by respective ones of said switches, whereby the time constant exhibited by said time constant means is determined by the resistance means connected to said capacitance means.

10. The control circuit of claim 9 wherein said integrated circuit includes a third input, said third input being connected to said variable oscillating means; and wherein said capacitance means of said time constant means is connected across said second and third inputs.

11. The control circuit of claim 7 wherein said operating control signals produced by said frequency discriminating means further include a power control signal for controlling a power supply included in said signal receiver and an audio volume control signal for regulating the audio volume of said signal receiver.

12. The control circuit of claim 11 further comprising pulse generating means included in said integrated circuit and connected to receive said channel selecting signals produced by said frequency discriminating means, said pulse generated means being connected to an output of said integrated circuit for supplying a train of pulses thereto, the number of pulses in said train being dependent upon the particular channel selecting signal produced by said frequency discriminating means; pulse counting means connected to said output of said integrated circuit, said pulse counting means being reset to an initial count in response to the first pulse in said train and thereafter counting the remaining pulses in said train; and signal generating means coupled to said counting means for generating a signal whose magnitude is a function of the count reached by said counting means.

13. The control circuit of claim 11 wherein said volume control signal comprises a volume increasing portion and a volume decreasing portion; wherein said integrated circuit includes a first output for providing said power control signal produced by said frequency discriminating means, a second output for providing said volume increasing portion of said volume control signal, and a third output for providing said volume decreasing portion of said volume control signal; and further comprising bistate means coupled to said first output for being set and reset by said power control signal, the set state of said bistate means being operative to supply operating power to said signal receiver and the reset state of said bistate means being operative to remove operating power from said signal receiver; up/down counter means coupled to said second and third outputs of said integrated circuit; means for supplying clock pulses to said up/down counter means, said up/down counter means being conditioned to count said clock pulses in one direction in response to said volume increasing portion of said volume control signal and to count said clock pulses in an opposite direction in response to said volume decreasing portion of said volume control signal; and means for converting the count of said up/down counter means to an audio amplifier gain adjust signal.

14. The control circuit of claim 7 wherein said remotely generated control signals comprise sonic signals having different frequency components, and further comprising a sonic signal receiver for receiving said sonic signals to produce corresponding electrical signals; and means for supplying said electrical signals to said first input of said integrated circuit.

15. The control circuit of claim 14 further comprising a remote control sonic signal generated comprised of a plurality of switches, each associated with a respective operation of said signal receiver; variable oscillator means for generating an oscillating signal of selectable frequency; frequency control means coupled to said variable oscillator means and responsive to the operation of a particular switch for controlling said variable oscillator means to generate an oscillating signal of associated frequency; and means for transmitting a sonic signal having a frequency component determined by the frequency of said oscillating signal.

* * * * *